US 7,856,709 B2

(12) United States Patent
Bresche et al.

(10) Patent No.: US 7,856,709 B2
(45) Date of Patent: Dec. 28, 2010

(54) METHOD FOR HIGH-FREQUENCY TUNING AN ELECTRICAL DEVICE

(75) Inventors: Peter Bresche, Berlin (DE); Ulrich Hetzer, Berlin (DE)

(73) Assignee: ADC GmbH, Berlin (DE)

( * ) Notice: Subject to any disclaimer, the term of this patent is extended or adjusted under 35 U.S.C. 154(b) by 0 days.

(21) Appl. No.: 12/053,154

(22) Filed: Mar. 21, 2008

(65) Prior Publication Data

US 2008/0166919 A1    Jul. 10, 2008

Related U.S. Application Data

(63) Continuation of application No. 10/547,498, filed as application No. PCT/EP2004/001952 on Feb. 27, 2004, now Pat. No. 7,401,402.

(30) Foreign Application Priority Data

Mar. 11, 2003   (DE) ................. 103 10 434

(51) Int. Cl.
*H05K 3/02* (2006.01)
(52) U.S. Cl. ............... 29/847; 29/825; 29/831; 29/846; 439/676; 439/941
(58) Field of Classification Search .......... 29/847, 29/825, 831, 832, 842, 846; 439/620.09, 439/676, 894, 941
See application file for complete search history.

(56) References Cited

U.S. PATENT DOCUMENTS

| 4,190,854 A | 2/1980 | Redfern |
| 4,439,814 A | 3/1984 | Rhodes |
| 4,604,513 A | 8/1986 | Lim |
| 4,792,779 A | 12/1988 | Pond et al. |
| 4,905,358 A | 3/1990 | Einbinder |

(Continued)

FOREIGN PATENT DOCUMENTS

DE    196 46 774    5/1998

(Continued)

OTHER PUBLICATIONS

Certified English translation of DE 196 46 774 A1, published May 14, 1998, which was cited in the previous Office Action (15 pages including the certification).

*Primary Examiner*—Thiem Phan
(74) *Attorney, Agent, or Firm*—Merchant & Gould P.C.

(57) ABSTRACT

The invention relates to a method for high-frequency tuning a high-frequency plug connector, comprising a printed circuit board that has both contact points for high-frequency contacts as well as contact points for insulation displacement contacts. Each contact point for the high-frequency contacts is connected to one respective contact point for the insulation displacement contacts. Capacitive couplings, which cause a near-end crosstalk, occur between the high-frequency contacts. At least one first conductor path, which is connected on only one side to a contact point of an electrical contact, is situated on the printed circuit board that, together with at least one second conductor path, which is situated on and/or in the printed circuit board, forms a capacitor. At least one frequency-dependent parameter of the device is measured, and this frequency-dependent parameter is compared to a set parameter and, according to on a difference between the two, the conductor path that is contacted on one side is partially removed or completely separated.

16 Claims, 3 Drawing Sheets

U.S. PATENT DOCUMENTS

| | | | |
|---|---|---|---|
| 4,947,020 A | | 8/1990 | Imamura et al. |
| 5,299,956 A | * | 4/1994 | Brownell et al. ............ 439/638 |
| 5,420,515 A | | 5/1995 | Uhling et al. |
| 5,428,204 A | | 6/1995 | Uhling et al. |
| 5,446,260 A | | 8/1995 | Uhling et al. |
| 5,525,910 A | | 6/1996 | Uhling et al. |
| 5,569,398 A | | 10/1996 | Sun et al. |
| 5,602,483 A | | 2/1997 | Uhling et al. |
| 5,685,995 A | | 11/1997 | Sun et al. |
| 5,808,272 A | | 9/1998 | Sun et al. |
| 5,963,111 A | | 10/1999 | Anderson et al. |
| 6,023,200 A | | 2/2000 | Rhee |
| 6,310,527 B1 | | 10/2001 | Sugawara et al. |
| 6,333,472 B1 | | 12/2001 | Weatherley |
| 6,428,362 B1 | | 8/2002 | Phommachanh |
| 6,464,541 B1 | * | 10/2002 | Hashim et al. ............ 439/676 |
| 6,875,950 B2 | | 4/2005 | Naumov et al. |
| 6,953,362 B2 | | 10/2005 | Mossner et al. |
| 7,025,621 B2 | | 4/2006 | Mossner et al. |
| 2003/0171024 A1 | | 9/2003 | Mossner et al. |

FOREIGN PATENT DOCUMENTS

| | | |
|---|---|---|
| DE | 100 51 097 | 3/2002 |
| EP | 0 525 703 | 2/1993 |
| GB | 2 133 933 | 8/1984 |
| KR | 10 039 4531 | 9/2003 |
| WO | WO 97/02627 | 1/1997 |
| WO | WO 00/55870 | 9/2000 |

* cited by examiner

METHOD FOR HIGH-FREQUENCY TUNING AN ELECTRICAL DEVICE

This application is a Continuation of application Ser. No. 10/547,498, filed 10 May 2006, now issued as U.S. Pat. No. 7,401,402, which is the National Stage of Application PCT/EP2004/001952, filed 27 Feb. 2004, and which application(s) are incorporated herein by reference.

TECHNICAL FIELD

This invention relates to a method for RF matching of an electrical arrangement, and to a printed circuit board which is suitable for this purpose.

BACKGROUND

EP 0 525 703 A1 discloses a plug connection for computer networks in the domestic area, comprising a male connector part and a female connector part, with a device for crosstalk compensation being arranged in the plug connection, by means of which the crosstalk attenuation between the transmission conductor loop and the reception conductor loop can be increased. For this purpose, a printed circuit board is arranged in the female connector part or in the male connector part of the plug connection between the connections for the plug-in cable and the connections for the wiring, with the conductor routes for the transmission and reception conductor loops being largely physically separated on the printed circuit board. The devices for crosstalk compensation are, for example, discrete components such as capacitors or coils, which are adjustable. The known plug connection has the disadvantage that the discrete components are relatively expensive and large.

DE 100 51 097 discloses an electrical plug connector comprising a plug connector housing, a printed circuit board with two sets of contact elements, with the first set of contact elements being arranged on the front face of the printed circuit board and projecting into an opening in the plug connector housing, and the second set of contact elements being arranged on the rear face of the printed circuit board, and the contact elements in the second set being in the form of insulation-displacement contacts, with the plug connector having a cable manager which has an opening through it and is provided on the front face with guides for conductors which are intended to make contact with the insulation-displacement contacts, with the guides being formed in the area of the insulation-displacement contacts with recessed holders for the insulation-displacement contacts, and in which case the cable manager can be matched to the plug connector housing.

Owing to the increasing bandwidth for data transmission in telecommunications and information technology, the conductors, contacts and conductor tracks have to be designed such that they are highly defined with respect to one another, in order to comply with the required values for the crosstalk attenuation.

This necessitates extremely tight tolerances, which can be complied with only with difficulty during automated manufacturing processes.

SUMMARY

The invention is thus based on the technical problem of providing a method for matching an RF plug connector, in particular an RJ-45 female connector, having at least one printed circuit board, with the printed circuit board having contact points for RF contacts and contact points for the insulation-displacement contacts, and with one contact point for the RF contacts in each case being connected to a respective contact point for the insulation-displacement contacts, and a printed circuit board which is suitable for this purpose and by means of which the RF characteristics can be adjusted within a narrow tolerance band.

For this purpose, at least one first conductor track, which is connected on only one side to a contact point of an electrical contact, is arranged on the printed circuit board and, together with at least one second conductor track which is arranged on or in the printed circuit board, forms a capacitor, with at least one frequency-dependent parameter of the arrangement being measured, the frequency-dependent parameter being compared with a nominal parameter, and the conductor track with which contact is made on one side being partially removed or cut through as a function of the difference. This makes it possible to form a matchable capacitor using simple and cost-effective means, and by means of which the RF response of the arrangement can be matched. The conductor tracks are in this case preferably connected to the contact points of the RF contacts, since this means that the matching capacitances are closer to the location of the source of the crosstalk. However, in principle, they may also be connected to the contact points of the insulation-displacement contacts, which are electrically connected to the contact points of the RF contacts. It should be noted that, in principle, it is sufficient to cut through or to remove one conductor track of a capacitor in order to change the capacitance.

The opposite electrode of the capacitor is preferably likewise formed by a conductor track that is connected to a contact point on one side.

In a further preferred embodiment, at least one further second conductor track is arranged in an internal layer in the printed circuit board and is electrically connected to the conductor track on the printed circuit board. This represents capacitances connected in parallel, so that the total capacitance is added, thus allowing the formation of a sufficiently large capacitance on a relatively small area.

In a further preferred embodiment, at least two independent capacitors which are formed by conductor tracks are arranged on the printed circuit board, in order to carry out symmetrical trimming with respect to ground.

In a further preferred embodiment, the frequency-dependent parameter is determined and adjusted on the unpopulated printed circuit board. This is based on the knowledge that, particularly in the case of RF plug connectors, the printed circuit board itself is responsible for the majority of the RF tolerances. These tolerances are generally geometric tolerances of the layout elements, such as conductor tracks, and tolerances of the dielectric constant of the material of the printed circuit board. Automatic measurement on an unpopulated printed circuit board is considerably easier than on a populated printed circuit board, or even on a printed circuit board that has been installed in a housing. The overall arrangement can thus be matched even at an early stage in the process of producing the printed circuit board. The feed and measurement are in this case preferably provided centrally in soldered eyes of the contact points.

In a further preferred embodiment, only a portion of the estimated conductor track shortening that is necessary is carried out in a first step. The frequency-dependent parameter is then measured once again. The measured change is then used to determine the remaining conductor track length that is still to be removed or to be cut. This also takes account of the tolerances relating to the conductor tracks in the matching process. The conductor track shortening can in this case also be subdivided into more than two steps.

In a further preferred embodiment, the final cut during the cutting of the conductor track is carried out in a broader manner than the first cut. This broader cut minimizes the capacitive influence of the cut part of the conductor track.

In a further preferred embodiment, the near crosstalk is determined as the frequency-dependent parameter, thus making the matching process easier, since the parameter to be optimized directly is determined, so that there is no need for any further estimates of the influence of the parameter on the near crosstalk as would be the case, for example, with pure capacitance measurement.

The conductor track is preferably cut by means of a laser, preferably by means of a short-wave laser with a wavelength that is shorter than 600 nm. The use of a laser for cutting the conductor track is extremely fast, and can easily be automated. In principle, the conductor track can also be cut or removed mechanically, for example by means of milling or electrically by using an overcurrent to burn through it.

In a further preferred embodiment, the laser has an associated optical positioning system. This results in the conductor track being cut in a more defined manner, without any damage to closely adjacent conductor tracks and without the conductor track to be cut not being cut completely.

During removal or cutting of the conductor track, it is possible for copper particles to be deposited on the printed circuit board, and these in turn reduce the resistance to overvoltages. The cutting or removal of the conductor track is thus preferably followed by a cleaning step to remove the copper particles and/or any other contamination.

The invention will be explained in more detail in the following text with reference to a preferred exemplary embodiment. In the figure:

DETAILED DESCRIPTION

Figure 1:
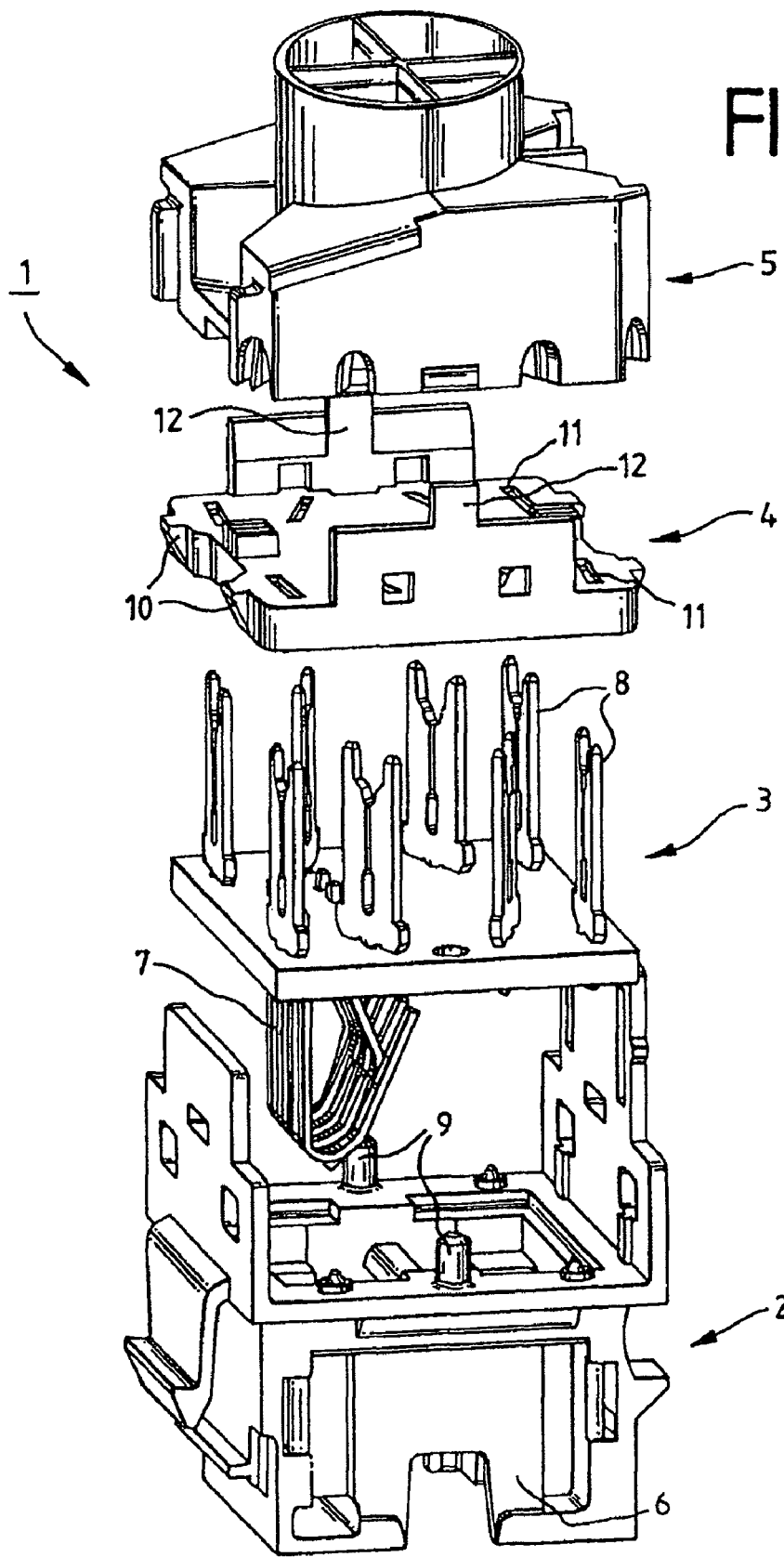
FIG. 1 shows an exploded illustration of a plug connector for transmitting RF data (prior art)

FIG. 1 shows an exploded illustration of a plug connector 1. The plug connector 1 has a plug connector housing 2, a printed circuit board 3, a hold-down device 4 and a cable manager 5. The plug connector housing 2 in the illustrated example is in the form of a female connector housing with various latching and insertion means. The plug connector housing 2 has a shielding plate 6 on the side surfaces. The printed circuit board 3 is fitted on its front face with a first set of contacts 7, and is fitted on its rear face with a second set of insulation-displacement contacts 8. One contact 7 in the first set is connected to a respective contact 8 in the second set. The printed circuit board 3 is then inserted into the plug connector housing 2. In the process, cylindrical pins 9 of the plug connector housing 2 pass through holes in the printed circuit board 3, so that the plug connector housing 2 and the printed circuit board 3 are adjusted and fixed with respect to one another. The contacts 7 (which are in the form of RF contacts) in the first set then project into an opening which is accessible from the front face of the plug connector housing. The hold-down device 4 is then pushed over the contacts 8 in the second set, and is latched to the plug connector housing 2. For this purpose, the hold-down device 4 has latching tabs 10 on the end face, and has openings 11 through it for the insulation-displacement contacts 8. Furthermore, the hold-down device 4 has two latching hooks 12, which are used for latching to the cable manager 5.

Figure 2:
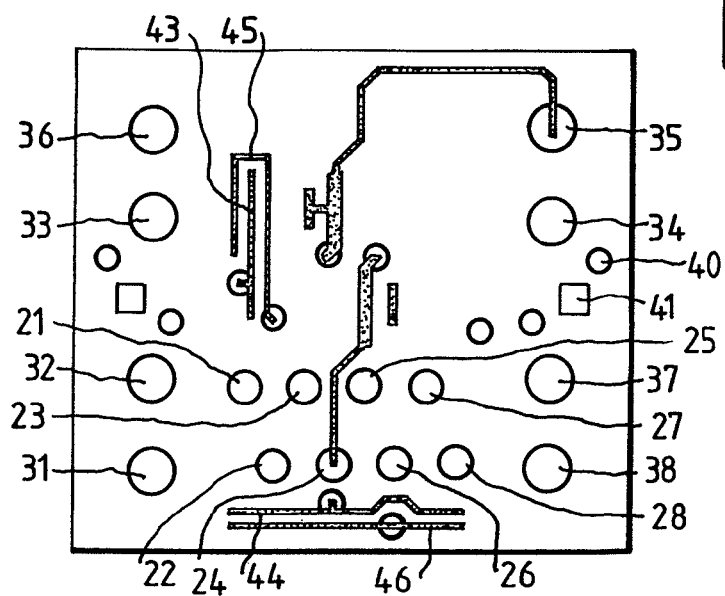
FIG. 2 shows a printed circuit board for use in a plug connector shown in FIG. 1.

FIG. 2 shows the unpopulated printed circuit board 3. The printed circuit board 3 has eight contact points 21-28 and contact holes for the RF contacts, and eight contact points 31-38 for the insulation-displacement contacts. The printed circuit board 3 also has further plated-through holes 40 for connection of conductor tracks on the front face and rear face and internal layers in the printed circuit board, with the plated-through holes 40 being illustrated as small circles. The holes 41 in the printed circuit board 3 are in this case illustrated as small squares. The conductor tracks which connect the contact points 21-28 to their respectively associated contact point 31-38 are not shown, with the exception of two parts of the contact points 24 and 35 since they are arranged on the rear face and/in the internal layers of the printed circuit board. In addition to the electrically connected conductor tracks between two contact points 21-28 and 31-38, respectively, there are also four conductor tracks 43-46 which are respectively connected on one side to a contact point 23-26. In this case, the two conductor tracks 44 and 46 form a capacitor between the contact points 24 and 26. In a corresponding way, the two conductor tracks 43 and 45 form a capacitor between the contact points 23 and 25. A further conductor track is preferably arranged in an internal layer, is electrically connected to conductor track 44, and is located under the conductor track 46. For circuitry purposes, the contact points 21, 22; 23, 26; 24, 25 and 27, 28 and their respectively associated contacts form a contact pair. In this case, the two outer contact pairs 21, 22 and 27, 28 are relatively uncritical with regard to near crosstalk. The two inner and interleaved contact pairs 23, 26 and 24, 25, on the other hand, are problematic. The capacitances which cause disturbances in this case are located between 23 and 24 as well as between 25 and 26, since the other couplings are negligible, owing to the greater distances between them.

Figure 3:
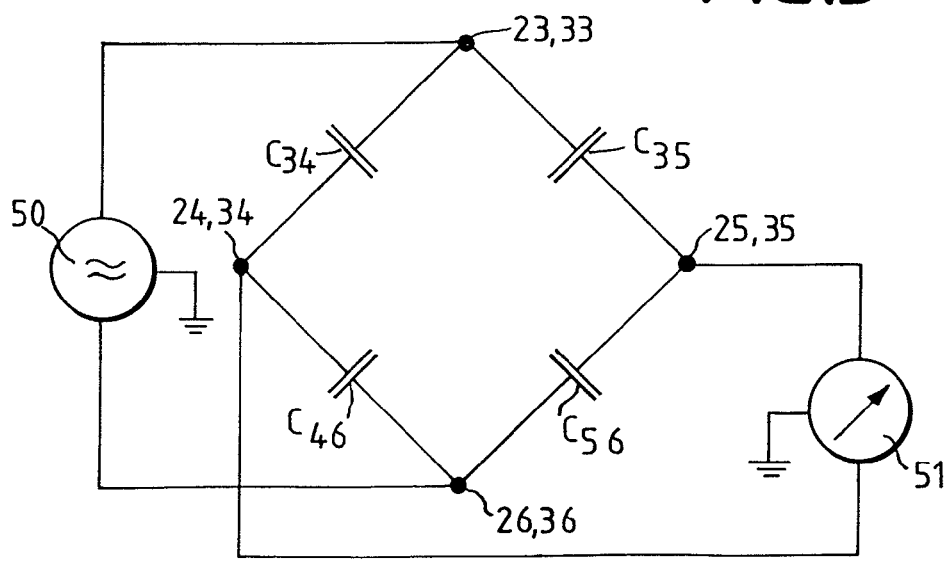
FIG. 3 shows a schematic equivalent circuit for the printed circuit board.

FIG. 3 shows the resultant equivalent circuit, including the schematic test layout. In this case, the capacitors $C_{46}$ and $C_{35}$ essentially represent capacitors formed by the conductor tracks 44 and 46 as well as 43 and 45, respectively, while, in contrast, the capacitors $C_{34}$ and $C_{56}$, respectively, are formed by the adjacent contact points 23, 33 as well as the associated conductor track, 24, 34 with the conductor track as well as 25, 35 with the conductor track, and 26, 36 with the conductor track. This bridge circuit can now be trimmed in order to force the near crosstalk below the required values. Before the trimming process, the asymmetry is first of all determined by determining the near crosstalk of one contact pair as a frequency-dependent parameter. In the present case, crosstalk is determined between the contact pair 23, 33 and 26, 36 and the contact pair 24, 34; 25, 35. Since the measurement is preferably carried out on the unpopulated printed circuit board 3, the contact points 33-36 are terminated with the correct impedance. The near crosstalk to the contact points 25, 24 is then measured, with RF signals being injected into the contact points 23, 26, by means of a network analyzer which is symbolized in FIG. 3 by the frequency generator 50 and the measurement device 51. The feeding and measurement of the RF signals are in this case provided by means of a central contact in the solder eyes of the contact points 23-26.

Figure 4:
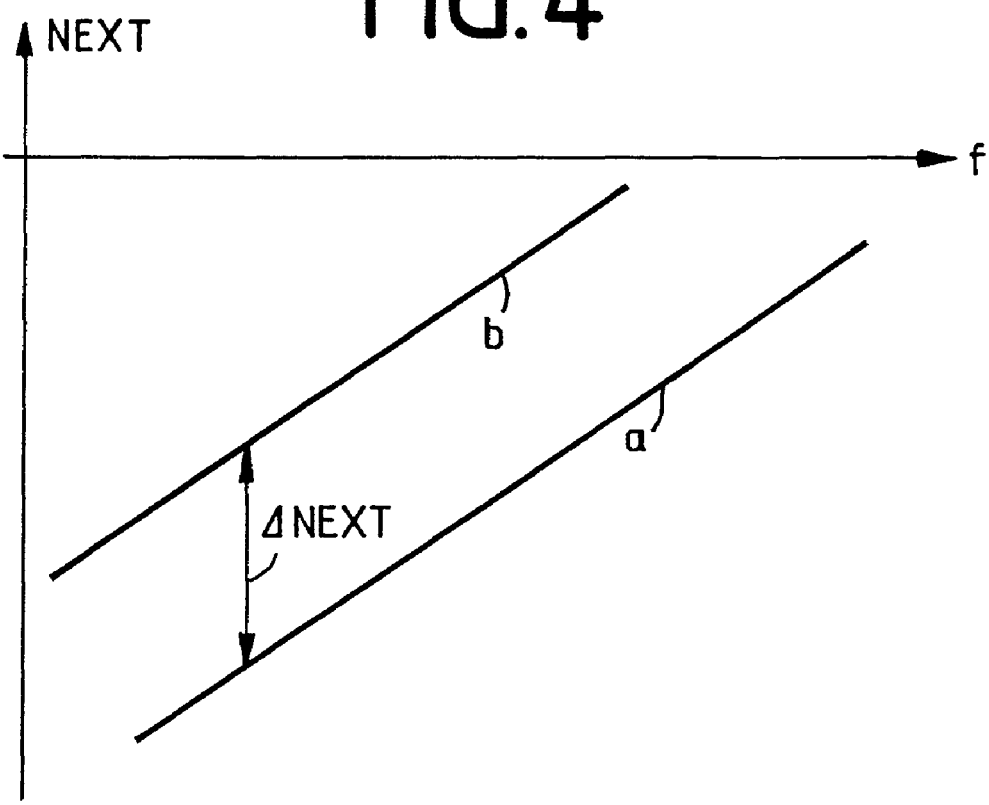
FIG. 4 shows a schematic frequency response for the near crosstalk and FIG. 5 shows a family of curves for the attenuation D of the near crosstalk as a function of the length of the conductor track to be removed.
Figure 5:
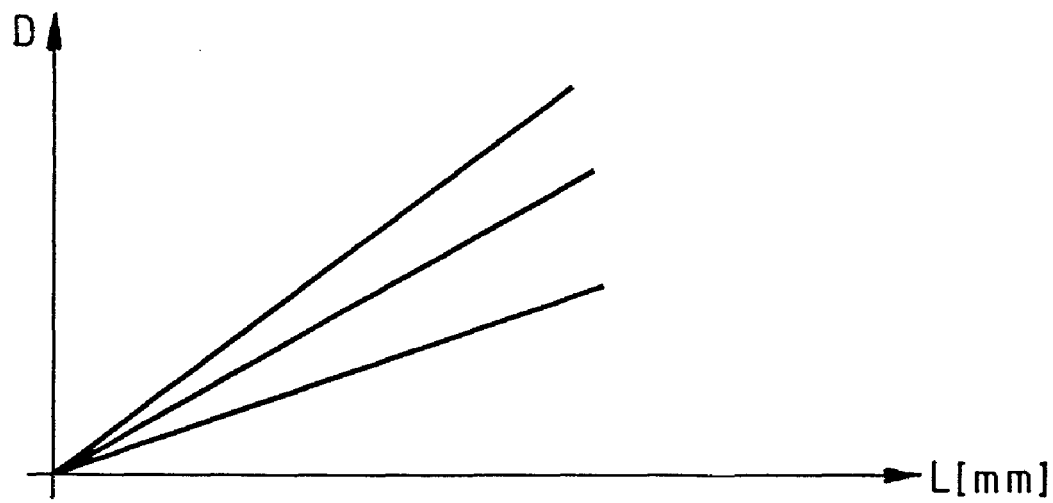

FIG. 4 schematically shows the frequency response of the near crosstalk NEXT, with the profile a representing nominal near crosstalk, and the profile b representing the measured actual near crosstalk for a measured printed circuit board. The nominal near crosstalk is determined, for example, by means of a golden device. In this case, the measured near crosstalk is too high by an amount ΔNEXT, so that this must be compensated for by shortening the conductor tracks, thus reducing the capacitance. The measure of how many millimeters of conductor track correspond to what capacitance and thus to the near crosstalk attenuation D depends on the tolerances of the printed circuit board, such as the dielectric constant or the distance between the conductor tracks. There is therefore no single straight line, but an entire family of curves, as is illustrated schematically in FIG. 5. Since the tolerances are unknown, it may first of all be necessary to determine which curve is applicable to the printed circuit board to be matched. For this purpose, a piece of conductor track is first of all removed or cut through, and the measurements are then carried out once again. The increase in the attenuation D that is found can then be used to determine the associated curve. If, on the other hand, the desired attenuation is greater than that which can be achieved with the steepest curve, the entire conductor track can be removed or cut through without any intermediate step. The method is then repeated on the other capacitor.

The conductor track is preferably cut through by means of a short-wave laser, whose power and focusing are matched to the copper track to be cut such that, as far as possible, this is all that is removed. The advantage of a laser is its high speed with good reproducibility, so that the matching process can easily be automated.

LIST OF REFERENCE SYMBOLS

1) Plug connector
2) Plug connector housing
3) Printed circuit board
4) Hold-down device
5) Cable manager
6) Shielding plate
7) Contacts
8) Contacts
9) Cylindrical pins
10) Latching tabs
11) Openings
12) Latching hook
21) Contact points (for RF contacts)
22) Contact points (for RF contacts)
23) Contact points (for RF contacts)
24) Contact points (for RF contacts)
25) Contact points (for RF contacts)
26) Contact points (for RF contacts)
27) Contact points (for RF contacts)
28) Contact points (for RF contacts)
31) Contact point (for an insulation-displacement contact)
32) Contact point (for an insulation-displacement contact)
33) Contact point (for an insulation-displacement contact)
34) Contact point (for an insulation-displacement contact)
35) Contact point (for an insulation-displacement contact)
36) Contact point (for an insulation-displacement contact)
37) Contact point (for an insulation-displacement contact)
38) Contact point (for an insulation-displacement contact)
40) Plated-through hole
41) Hole
43) Conductor track
44) Conductor track
45) Conductor track
46) Conductor track
50) Frequency generator
51) Measurement device

The invention claimed is:

1. A method for RF matching on a printed circuit board, the printed circuit board having a plurality of contact points for electrical contacts, the printed circuit board including at least a first conductor track connected to a first pair of the electrical contacts and a second conductor track connected to a second pair of the electrical contacts, wherein a first end of the first conductor track is connected to a contact point of one of the electrical contacts, and wherein the second conductor track forms a capacitor with the first conductor track, the method comprising:
measuring near-end crosstalk between the first and second pairs of electrical contacts of the printed circuit board to obtain a first reading of near-end crosstalk;
removing at least a first portion of the first conductor track from the printed circuit board;
measuring the near-end crosstalk between the first and second pairs of electrical contacts of the printed circuit board to obtain a second reading of near-end crosstalk subsequent to removing at least the first portion of the first conductor track; and
removing at least a second portion of the first conductor track from the printed circuit board, a size of the second portion to be removed being determined based on an analysis of the first and second readings of near-end crosstalk and a size of the removed first portion.

2. The method as claimed in claim 1, wherein the near-end crosstalk is caused by capacitive coupling between at least two of the electrical contacts on the printed circuit board.

3. The method as claimed in claim 1, wherein the near-end crosstalk is measured on the printed circuit board when the printed circuit board is unpopulated.

4. The method as claimed in claim 1, wherein near-end crosstalk is measured as a frequency-dependent parameter.

5. The method as claimed in claim 1, wherein the first and second portions of the first conductor track are removed using a laser.

6. The method as claimed in claim 5, wherein the laser is controlled, at least in part, based on data obtained by an optical system.

7. The method as claimed in claim 1, further comprising:
determining a series of profiles indicating attenuation as a function of conductor track size based on potential tolerances of the printed circuit board.

8. The method as claimed in claim 7, wherein removing at least the second portion of the first conductor track based on the first and second readings of near-end crosstalk comprises:
selecting one of the profiles of the series based on the analysis of the first and second readings of near-end crosstalk as a first selected profile; and
removing at least the second portion of the first conductor track in accordance with the selected profile.

9. The method as claimed in claim 1, wherein the printed circuit board includes a second capacitor formed from a third conductor track and a fourth conductor track arranged on the printed circuit board, the third conductor track being associated with a third pair of electrical contacts and the fourth conductor track being associated with a fourth pair of electrical contacts, the method further comprising:
measuring near-end crosstalk between the third electrical contact pair and the fourth electrical contact pair to obtain a third reading of near-end crosstalk;

removing at least a first portion of the third conductor track subsequent to obtaining the third reading of near-end crosstalk;

measuring the near-end crosstalk between the third and fourth pairs of electrical contacts to obtain a fourth reading of near-end crosstalk subsequent to removing at least the first portion of the third conductor track; and removing at least a second portion of the third conductor track based on the third and fourth readings of near-end crosstalk.

10. The method as claimed in claim 9, further comprising:

determining a series of profiles indicating attenuation as a function of conductor track size based on potential tolerances of the printed circuit board.

11. The method as claimed in claim 10, wherein removing at least the second portion of the third conductor track based on the third and fourth readings comprises:

selecting one of the profiles of the series based on an analysis of the third and fourth readings as a second selected profile; and removing at least the second portion of the third conductor track comprises removing at least the second portion of the third conductor track in accordance with the second selected profile.

12. The method as claimed in claim 1, wherein the contact points of the printed circuit board include contact points for RF plug contacts and contact points for insulation-displacement contacts, wherein one contact point for each of the RF plug contacts is connected to a contact point for a respective one of the insulation-displacement contacts.

13. The method as claimed in claim 1, wherein measuring the near-end crosstalk comprises injecting RF signals into contact points of some of the electrical contacts with a network analyzer.

14. The method as claimed in claim 1, wherein removing at least the first portion of the first conductor track comprises removing at least the first portion of the first conductor track based on a comparison between the first reading and a nominal near-end crosstalk reading.

15. The method as claimed in claim 1, wherein removing at least the first portion of the first conductor track shortens the first conductor track.

16. The method as claimed in claim 1, wherein removing at least the first portion of the first conductor track comprises cutting through the first conductor track.

* * * * *